United States Patent [19]

Herrick et al.

[11] 3,902,375

[45] Sept. 2, 1975

[54] KNOB MECHANISM FOR TV TUNER

[75] Inventors: Donald A. Herrick, Harwood Heights; Robert M. Dominiak, Chicago, both of Ill.

[73] Assignee: Admiral Corporation, Chicago, Ill.

[22] Filed: Mar. 18, 1974

[21] Appl. No.: 452,062

[52] U.S. Cl. ........... 74/10.54; 74/553; 116/124.1 R; 116/DIG. 29

[51] Int. Cl.² ........................ H03J 1/14; F16H 35/18

[58] Field of Search .......................... 74/10.54, 553; 116/124.1 R, DIG. 29

[56] References Cited

UNITED STATES PATENTS

| | | | |
|---|---|---|---|
| 2,738,758 | 3/1956 | Cutler et al. | 116/DIG. 29 |
| 3,142,995 | 8/1964 | Forrest | 74/10.54 |
| 3,385,116 | 5/1968 | Carlson et al. | 74/10.54 |
| 3,438,272 | 4/1969 | Badger | 74/10.54 X |
| 3,844,176 | 10/1974 | Valdettaro | 74/10.54 |

*Primary Examiner*—Allan D. Herrmann

[57] ABSTRACT

A manual operator for a television tuner which includes a unique arrangement of a knob for channel selection and fine tuning ring which is radially larger than the knob and concentric therewith. While the fine tuning ring is larger than the channel select knob, it operates a center shaft of a tuner and the channel select knob operates a channel select shaft which is concentric with and radially larger than the central fine tuning shaft.

10 Claims, 4 Drawing Figures

KNOB MECHANISM FOR TV TUNER

BACKGROUND OF THE INVENTION

1. Description of the Prior Art

UHF tuners have been desgined in such a way that the center shaft is the fine tuning mechanism while a concentric outer shaft provides the channel select function. Accordingly, the manual operator or knob means which has been employed in the past includes a central knob for operating the fine tuning arrangement and an outer knob or ring for channel selection. By the present invention, the central knob has been used for channel selection and the outer ring has been used for fine tuning adjustment by means of a unique arrangement of knobs and shaft couplers for the tuner.

2. Field of the Invention

The field of art to which this invention pertains is control means for operating a tuner and in particular to tuner knob arrangements for operating a UHF tuner having a central fine tuning shaft.

SUMMARY OF THE INVENTION

It is an important feature of the present invention to provide an improved knob arrangement for a UHF tuner.

It is another feature of the present invention to provide a knob arrangement for a UHF tuner which conforms the UHF tuning operation to the type of operation normally found in VHF tuners.

It is an important object of the present invention to provide a manual operator for a UHF tuner where a central tuning shaft is operated by an outer knob and an outer tuning shaft is operated by an inner knob.

It is another feature of the present invention to provide a knob arrangement for a UHF tuner wherein the channel select operation is accomplished by a knob having pins extending through slots formed in the vertical wall of the fine tuning ring.

These and other objects, feataures and advantages of the present invention will be understood in greater detail from the following description and the associated drawings wherein reference numerals are utilized to desginate a preferred embodiment.

DESCRIPTION OF THE PREFERRED EMBODIMENT

Figures 1, 2, 3, 4:
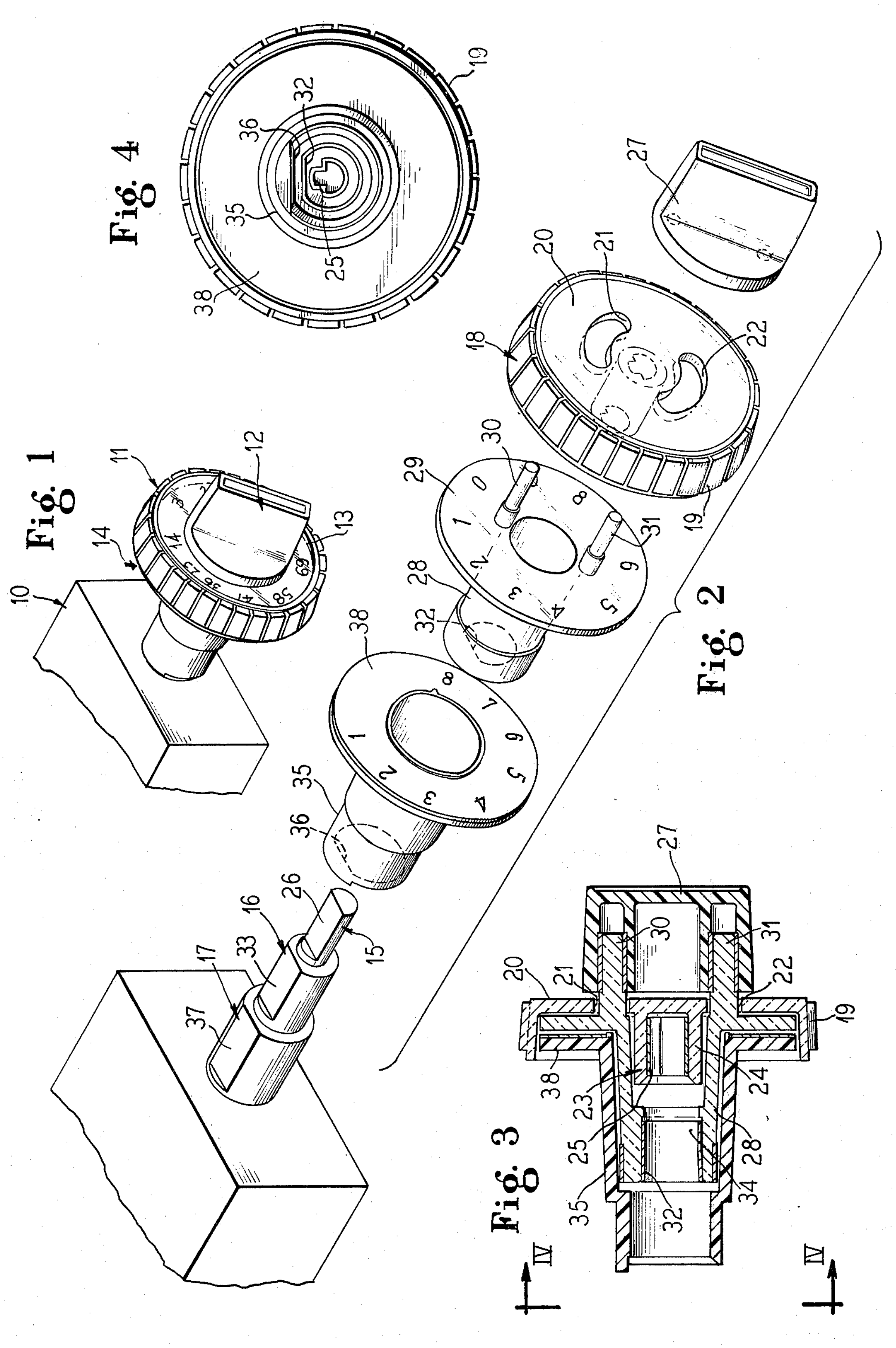
FIG. 1 is an elevational view of a knob arrangement of the present invention as mounted on a television tuner.
FIG. 2. is an exploded view of the knob arrangement of FIG. 1, showing the various segments which are used to operate the three tuning shafts of the tuner.
FIG. 3 is a longitudinal, sectional view taken through the knob arrangement of FIG. 1.
FIG. 4 is an electaional view taken along the lines IV—IV of FIG. 3.

The present invention relates to a knob arrangement for a television tuner and particularly to a UHF tuner that has the fine tuning adjustment shaft centrally located and channel selection shafts concentric therewith and extending radially outwardly of the fine tuning shaft. The present invention operates the central fine tuning shaft by an outer ring and employs an inner knob to operate the outer channel selection shaft. This is accomplished by forming slots in the outer fine tuning ring through which the inner knob can reach to operate the outer diameter channel selection shaft. The particular tuner employed in the present invention has three shafts, the first being the fine tuning central shaft, the second being the units channel selector shaft, and the third being the decade channel selector shaft. The third shaft increments one notch each time the units channel selector shaft increments ten notches. By this arrangement the UHF tuner can be made to conform in its manual operation to that of a VHF tuner which normally has the fine tuning at an outer diameter ring.

Referring to the drawings in greater detail, FIG. 1 shows a UHF tuner 10 and a knob arrangement 11 for operating the tuner. The knob arrangement 11 consists of a central knob 12 which is used to provide for channel selection and an outer ring 13 which is used for fine tuning. The channel number appears below an indicator 14 and consists of a units digit and a tens digit. The units digit is rotated by rotating the knob 12 and turning the units shaft. The tens digit increments each time the units digit has been rotated through ten stops.

The exploded view of FIG. 2 shows the details of the knob arrangement. Referring to the tuner itself, there are three shafts 15, 16, 17. The shaft 15 extends through the center of the shafts 16 and 17 and operates the fine tuning adjustment of the tuner 10. The shaft 16 extends through the shaft 17 and operates the units channel selection portion of the tuner. Shaft 17 operates the decade channel selection portion of the tuner. When the shaft 16 is moved through 10 stops, a gearing arrangement causes the shaft 17 to increment one position. In this way the combination of the shafts 16 and 17 can tune and count as many as 80 different channels.

A fine tuning ring 18 has a surface 19 which is used to accomplish the tuning and a support wall 20 having a pair of arcuate slots 21 and 22.

A shaft coupler 23 is formed integrally with the support wall 20 and consists of a tubular portion 24 having a flat surface 25 to engage the flat surface 26 of the tuning shaft 15.

The fine tuning ring in the preferred embodiment is made of plastic, and the support wall 20 is designed to be transparent so that the indicia on the other portions of the mechanism can be seen through the support wall. The flat portion 25 of the inner surface of the tubular member 24 is reinforced with a metal lining so that the unit can withstand the torque of operating the shaft 15.

In order to operate the channel selector shaft 16 by a knob which is smaller than the tuning ring 18, the knob must operate the shaft through the tuning ring. This is accomplished by the use of the arcuate slots 21 and 22 in the tuning ring.

A knob 27 is provided as the means for operating the channel select shaft. A second portion of the channel select drive mechanism takes the form of a tubular member or shaft coupler 28 which is formed integrally with a radially extending wall portion 29. The wall portion 29 is also formed of clear or transparent plastic and has indicia thereon to indicate the units digit of the channel being selected.

A pair of pins 30 and 31 extend from the wall 29 through the arcuate openings 21 and 22 to the knob 27.

Like the tuning ring 18, the tubular member 28 has a flat surface 32 which cooperates with the flat surface 33 of the shaft 16 to key or couple the members together. Also as in the case of the flat surface 25, the surface 32 has a metal reinforcement member 34 to permit the plastic coupler to withstand the torque of turning the channel selector shaft 16.

Finally, a tubular shaft coupler 35 is provided to operate together with the shaft 17. The coupler 35 has a flat surface 36 which functions with the flat surface 37 of the shaft 17 to permit the member 35 to be rotated when the shaft 17 increments one step.

Like the member 28, the coupler 35 has a radially extending wall 38 which has indicia thereon representing the tens or decade channel selection.

In operation, when it is desired to turn the channel, the knob 27 is rotated. Each time the knob 27 increments one step, the indicia on the wall 29 advances one step past the pointer 14 to indicate the channel number being selected. Each time the wall 29 has made one complete revolution, the shaft 17 increments one step, thereby advancing the wall 38 one step to move the tens digit in position at the pointer. Since there are eight digits on the wall 38, this corresponds to eight revolutions of the wall 29 or 80 incremental channel steps.

After each channel is selected, fine tuning may be accomplished by rotating the ring 18 and thereby adjusting the position of the shaft 15. The ring 18 is rotated by virtue of the arcuate slots 21 and 22 which encompass a substantial angle about the pins 30 and 31.

Through this arrangement, a UHF tuner having the fine tuning at the center shaft may be made to conform to the normal VHF tuning arrangement where a central knob is used to make channel selection and an outer ring is used to accomplish fine tuning.

We claim as our invention:

1. The combination of a television tuner and manual means for operating the tuner, said tuner having a central shaft for fine tuning adjustment and a concentric outer shaft for a detent channel selection, said manual means including a first manual rotary operator coupled to the concentric outer shaft and a second manual rotary operator coupled to the central fine tuning shaft, said second manual rotary operator having a fine tuning operator surface extending radially outwardly of the channel select operator surface of the first manual rotary operator, whereby fine tuning may be adjusted by rotating a member which is radially outwardly of and generally concentric with the channel select operator surface of the first manual rotary operator.

2. The combination of claim 1 wherein said second manual rotary operator has a radially extending support and an associated shaft portion, said radially extending support connecting the associated shaft portion with the fine tuning operator surface, and said first manual rotary operator having support means extending through the radially extending support of the fine tuning operator surface to couple to the concentric outer shaft for detent channel selection.

3. The combination in accordance with claim 2 wherein said radially extending support comprises a radial wall having openings therein through which said support means of the channel select operator extend.

4. The combination in accordance with claim 3 wherein the openings in the radial wall comprises arcuate slots and wherein the support means comprise channel select drive pins extending through the slots to drive the channel select shaft, whereby the fine tuning operator surface may be rotated by causing the arcuate slots to move about the relatively stationary channel select drive pins.

5. A manual operator for a television tuner which has a center fine tuning shaft and an outer concentric detent channel select shaft comprising:

a fine tuning ring having a radially inwardly centrally located shaft coupler for coupling to the fine tuning shaft, a channel select knob having a centrally located shaft coupler for coupling to the outer concentric detent channel select shaft, said channel select knob being spaced from its associated centrally located shaft coupler and having a number of pin supports extending therebetween, the pin supports of the channel select knob passing through the fine tuning ring to connect the channel select knob with its shaft coupler at opposite sides of the fine tuning ring, and the shaft coupler of the channel select knob being positioned concentrically outwardly of the shaft coupler of the fine tuning shaft.

6. A manual operator in accordance with claim 5 wherein a support wall extends from the fine tuning ring to its associated shaft coupler, said wall having a number of slots formed therein and the support pins of the channel select knob extending through the slots to permit relative rotary movements between the channel select knob and the fine tuning ring.

7. A manual operator in accordance with claim 6 wherein the shaft coupler associated with the channel select knob has a radially outwardly extending indicator wall, said indicator wall having channel indicia thereon, the support wall of the fine tuning ring being entrapped between said indicator wall and the channel select knob, said support wall of the fine tuning ring being formed of a transparent material to permit the reading therethrough of the indicia on the indicator wall.

8. A manual operator for a television tuner which has a center fine tuning shaft, an intermediate shaft concentric with and radially outwardly of the center shaft for units channel selection and an outer shaft concentric with and radially outwardly of the intermediate shaft for decade channel selection comprising:

a fine tuning ring having a radially inwardly centrally located shaft coupler for coupling to the fine tuning shaft, a channel select knob having a centrally located shaft coupler for coupling to the intermediate channel select shaft, said channel select knob being spaced from its associated centrally located shaft coupler and having a number of pin supports extending therebetween, the pin supports of the channel select knob passing through the fine tuning ring to connect the channel select knob with its shaft coupler at opposite sides of the fine tuning ring, the shaft coupler of the channel select knob being positioned concentrically outwardly of the shaft coupler of the fine tuning shaft and an outer shaft coupler positioned concentrically outwardly of the intermediate shaft coupler for being freely rotated by the outer tuner shaft independently of the fine tuning ring.

9. A manual operator in accordance with claim 8 wherein a support wall extends from the fine tuning ring to its associated shaft coupler, said wall having a number of slots formed therein and the support pins of the channel select knob extending through the slots to permit relative rotary movements between the channel select knob and the fine tuning ring.

10. A manual operator in accordance with claim 9 wherein the shaft coupler associated with the channel select knob has a radially outwardly extending indicator wall, said indicator wall having channel indicia thereon, the support wall of the fine tuning ring being entrapped between said indicator wall and the channel select knob, said support wall of the fine tuning ring being formed of a transparent material to permit the reading therethrough of the indicia on the indicator wall, said outer shaft coupler having a radially outwardly extending indicator wall having decade indicia thereon, and said support wall also being transparent to permit the reading therethrough of said decade indicia.

* * * * *